United States Patent [19]
Nakamiya et al.

[11] Patent Number: 5,929,715
[45] Date of Patent: Jul. 27, 1999

[54] OSCILLATION CIRCUIT HAVING ELECTROSTATIC PROTECTIVE CIRCUIT

[76] Inventors: Shinji Nakamiya; Hiroshi Yabe; Tadao Kadowaki; Yoshiki Makiuchi, all of 3-5, Owa 3-chome, Suwa-shi, Nagano-ken, Japan

[21] Appl. No.: 08/984,174

[22] Filed: Dec. 3, 1997

[30] Foreign Application Priority Data

Dec. 4, 1996 [JP] Japan ................................ 8-339043

[51] Int. Cl.⁶ .............................. H03B 5/32; H03L 1/00; H03L 5/00; G04F 5/06
[52] U.S. Cl. ........................ 331/62; 331/158; 331/186; 368/159
[58] Field of Search .................... 331/62, 116 R, 331/116 FE, 158, 186; 368/156, 159

[56] References Cited

U.S. PATENT DOCUMENTS

| | | | |
|---|---|---|---|
| 3,868,597 | 2/1975 | Gollinger | 331/116 R |
| 3,939,644 | 2/1976 | Wolf | 331/116 R |
| 4,048,584 | 9/1977 | Ulmer | 331/62 |
| 4,066,918 | 1/1978 | Heuner et al. | 327/318 |
| 4,605,980 | 8/1986 | Hartranft et al. | 361/56 |
| 5,546,055 | 8/1996 | Klughart | 331/116 FE |

FOREIGN PATENT DOCUMENTS

A-296 675  12/1988  European Pat. Off. .

*Primary Examiner*—Siegfried H. Grimm
*Attorney, Agent, or Firm*—Oliff & Berridge, PLC

[57] ABSTRACT

An oscillation circuit is driven at reduced power by a constant voltage $V_{reg}$ having an absolute value that is lower than that of a power voltage $V_{ss}$ of a main power source. An electrostatic protective circuit provided in this oscillation circuit is connected between a signal path and this constant voltage $V_{reg}$. It comprises a first electrostatic protective circuit portion that causes any electrostatic voltage of a first polarity that invades the signal path to be selectively diverted through a diode to the constant voltage $V_{reg}$ side of the circuit, and any electrostatic voltage of a second polarity that invades the signal path to be selectively diverted through another diode to the ground side. This ensures that the oscillation circuit is not affected by fluctuations in the power voltage from the main power source, enabling it to oscillate at a stable frequency.

8 Claims, 8 Drawing Sheets

FIG.5A
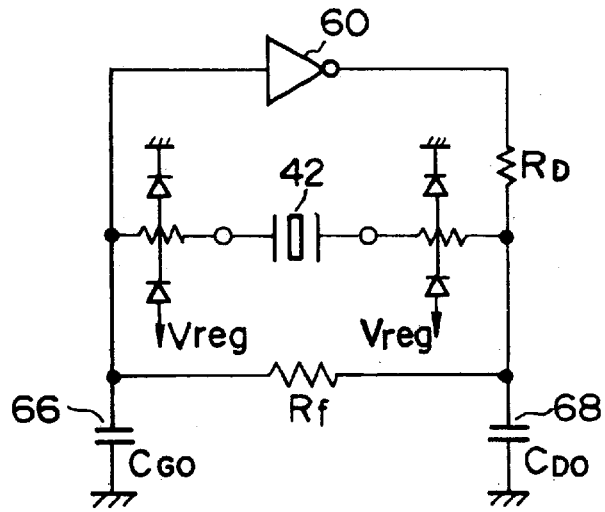
FIG.5B
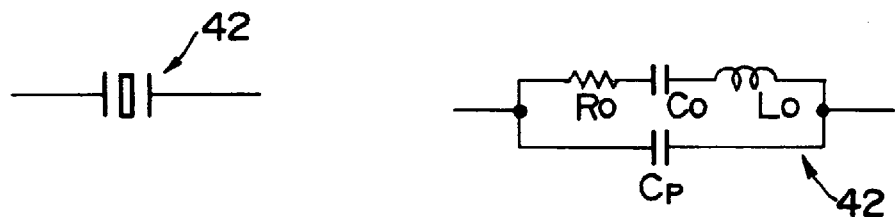
FIG.5C
FIG.5D
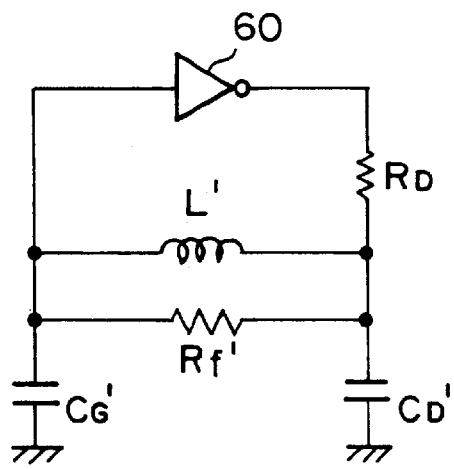
$C_G'$ ; $C_{GO}$, $C_O$, $C_P$, $C_{VDD}$
$C_D'$ ; $C_{DO}$, $C_O$, $C_P$, $C_{VSS}$ $C_{GP}$, $C_{DP}$ : WIRING CAPACITANCES

OSCILLATION CIRCUIT HAVING ELECTROSTATIC PROTECTIVE CIRCUIT

BACKGROUND OF THE INVENTION

1. Field of the Invention

This invention relates to an oscillation circuit and an electronic circuit, as well as to a semiconductor device, a timepiece, and an electronic device equipped with the same.

2. Description of the Related Art

Many of today's wristwatches and other portable electronic devices use a disposable battery as a main power source and also have a rechargeable secondary battery, to drive the electronic circuitry thereof. The electronic circuitry in such devices often creates a reference clock signal from the oscillation frequency fs of an oscillation circuit.

The main circuit components of this oscillation circuit are usually formed on a semiconductor board and a crystal oscillator that is provided in a separate location from this semiconductor board is connected thereto by an input-output terminal. Therefore, an electrostatic protective circuit is provided on an input-output terminal side of these main circuit components, to protect those main circuit components from any surge voltage that may invade from the outside through the input-output terminals.

This causes a problem in that, if the load on the electronic circuitry should increase, causing fluctuations in the voltage $V_{ss}$ of the main power source, these fluctuations will induce fluctuations in the parasitic capacitance of the electrostatic protective circuit and, as a result, the oscillation frequency of the oscillation circuit will also fluctuate.

Therefore, the electrostatic protective circuit comprises a diode connected between a signal line and the ground side and a diode connected between the signal line and the main power source $V_{ss}$ side, and it is designed to protect the internal circuitry by selectively diverting any surge voltage that invades this signal line toward either the ground side or the power-voltage side, depending on the polarity of the surge voltage.

Unfortunately, the parasitic capacitance is created at the pn junctions of the diodes of this electrostatic protective circuit. The magnitude of this parasitic capacitance varies with fluctuations in the power voltage $V_{ss}$ caused by factors such as fluctuations in load.

However, if the parasitic capacitance varies in this manner, the oscillation constant of the oscillation circuit will also vary, changing the oscillation frequency itself. As a result, the reference clock signal frequency will vary, causing a problem in that the operation of the various components of the electronic circuitry will be adversely affected.

This causes a particular problem in an electronic circuit that uses the oscillating output of the oscillation circuit as a reference clock signal for a timepiece, such as an electronic circuit for a wristwatch, because if the oscillation frequency varies, the reliable operation of the timepiece itself will be lost.

SUMMARY OF THE INVENTION

A first object of this invention is to provide an oscillation circuit and electronic circuit that can oscillate at a stable frequency, without being affected by fluctuations in the voltage of the main power source, and also to provide a semiconductor device, timepiece, and electronic device equipped with the same.

A second objective of this invention is to provide an oscillation circuit and electronic circuit in which the parasitic capacitance of an electrostatic protective circuit that is provided for the oscillation circuit forms all or part of a phase-compensation capacitor that is part of the oscillation circuit, wherein the structure of the entire circuitry is simple and which can be highly integrated, and also to provide a semiconductor device, timepiece, and electronic device equipped with the same.

One aspect of this invention relates to an oscillation circuit that is driven by a constant voltage $V_{reg}$ having an absolute value that is lower than an absolute value of a power voltage $V_{ss}$ of a main power source, wherein the oscillation circuit comprises:

a first electrostatic protective circuit connected between a signal path of the oscillation circuit and the constant voltage $V_{reg}$ side of the oscillation circuit, for causing any electrostatic voltage of a first polarity that invades the signal path to be diverted selectively to the constant voltage $V_{reg}$ side through a first semiconductor rectifier element; and a second electrostatic protective circuit connected between the signal path of the oscillation circuit and a reference potential side of the oscillation circuit, for causing any electrostatic voltage of a second polarity that invades the signal path to be diverted selectively to the reference potential side through a second semiconductor rectifier element.

In a low-power type of electronic circuit, a constant voltage $V_{reg}$ is created from the power voltage $V_{ss}$ of the main power source, when an absolute value of the constant voltage $V_{reg}$ is lower than that of the power voltage $V_{ss}$. That constant voltage $V_{reg}$ is then supplied to the circuit components.

The oscillation circuit of this invention makes use of a configuration in which an electrostatic protective circuit is connected, not to the power voltage $V_{ss}$ of the main power source, but to the constant voltage $V_{reg}$ that is created from this power voltage $V_{ss}$. Since there are no fluctuations in the constant voltage $V_{reg}$ to which the electrostatic protective circuit is connected, even if there are fluctuations in the power voltage $V_{ss}$, this configuration makes it possible to suppress fluctuations in the parasitic capacitance of the semiconductor rectifier element that forms the electrostatic protective circuit.

This aspect of the invention makes it possible to obtain an oscillation circuit in which there are no fluctuations in oscillation frequency, even if there are fluctuations in the power voltage $V_{ss}$ of the main power source.

The components used as the first and second semiconductor rectifier elements in the electrostatic protective circuit could be diodes or bipolar transistors, as necessary.

The first electrostatic protective circuit may comprise:

a third semiconductor rectifier element connected between the signal path of the oscillation circuit and the power voltage $V_{ss}$, for causing any electrostatic voltage of the first polarity that invades the signal path to be diverted selectively to the power voltage $V_{ss}$ side.

The capacitance within a power supply circuit that creates the constant voltage $V_{reg}$ of a lower absolute value is smaller than that of the main power source that supplies the power voltage $V_{ss}$. Therefore, if an electrostatic protective circuit is connected only to the constant voltage $V_{reg}$ side and an extremely large surge voltage invades the circuit, that capacitance is far too small in comparison with that voltage and there is a danger that the circuit will be unable to handle the excess voltage. In contrast thereto, this invention can utilize a configuration in which a third semiconductor rectifier element is connected to the side of the power voltage $V_{ss}$ from the main power source, which has a larger capacitance than the constant-voltage circuit. This makes it possible for large currents to flow toward the main power source side, even if a large surge voltage should invade, making it possible to obtain an oscillation circuit which has a sufficiently large resistance to a surge voltage and which also provides a stable oscillating output.

The parasitic capacitance of the third semiconductor rectifier element may be set to be lower than the parasitic capacitance of the first semiconductor rectifier element.

It is particularly preferable that the parasitic capacitance of the third semiconductor rectifier element is set to be so much lower than the parasitic capacitance of the first semiconductor rectifier element, it can be ignored.

This makes it possible to achieve an oscillating output of an even more stable oscillation frequency which is substantially unaffected by any changes in the parasitic capacitance of the third semiconductor rectifier element, if it should vary as a result of fluctuations in the power voltage $V_{ss}$ of the main power source.

The parasitic capacitances of the first and second semiconductor rectifier elements may be used as all or part of the capacitance of a phase-compensation capacitor.

This configuration makes it possible to omit all or part of the phase-compensation capacitor, further increasing the degree of integration of the entire circuit.

In the prior art, a semiconductor rectifier element having a small parasitic capacitance and small size is used to configure each electrostatic protective circuit, to reduce the capacitance of the entire oscillation circuitry, restrict the power consumption of the oscillation circuit, and reduce the surface area of the resultant semiconductor device. It therefore often happens that the resistance to a surge voltage of the entire circuit that includes these semiconductor rectifier elements is insufficient. In contrast thereto, this invention makes it possible to configure an electrostatic protective circuit that makes active use of a semiconductor rectifier element which has a large parasitic capacitance. As a result, the resistance to a surge voltage of the semiconductor rectifier element itself can be increased, allowing it to function far better as an electrostatic protective circuit.

It is preferable that the oscillation circuit of this invention is used to form an electronic circuit.

This makes it possible to obtain an electronic circuit which operates favorably while using a stable frequency output from the oscillation circuit.

It is further preferable that the oscillation circuit or electronic circuit of this invention is used to form a semiconductor device.

In other words, when an oscillation circuit using a crystal oscillator, or an electronic circuit using such an oscillation circuit, is used in a semiconductor device, the configuration is often such that the main circuit components of the oscillation circuit formed on a circuit board are connected by wiring to a crystal oscillator which is provided in a different area of the same circuit board. In such a case, there is a danger that an electrostatic voltage such as a surge voltage could invade the main circuit components as noise from the connective portions between the crystal oscillator and the main circuit components, damaging the interior of the circuit.

In this case too, this invention makes it possible to implement a semiconductor device in which any electrostatic voltage such as a surge voltage that invades the circuitry can be excluded by using this electrostatic protective circuit, and which also allows the circuit components that use a stabilized oscillating output to operate satisfactorily.

The oscillation circuit or electronic circuit of this invention can also be used to form a timepiece.

This invention makes it possible to provide a timepiece that can keep time accurately, without being affected by any fluctuations in the voltage from the main power source that may occur.

The oscillation circuit or electronic circuit of this invention can also be used to form an electronic device.

This makes it possible to implement an electronic device which generates an accurate oscillating output to cause the circuit components to operate, without being affected by any fluctuations in the voltage from the main power source that may occur.

A timepiece or other electronic device formed by using the oscillation circuit or electronic circuit of this invention is particularly suitable for use as a portable timepiece or electronic device in which a disposable battery or rechargeable secondary battery is used as a main power source.

BRIEF DESCRIPTION OF THE DRAWINGS

FIG. 5A is an equivalent circuit diagram of the crystal oscillation circuit of FIG. 3, FIG. 5B is a illustrative diagram of the crystal oscillator, and FIG. 5C is an equivalent circuit diagram of the crystal oscillator, and FIG. 5D is an equivalent circuit diagram of FIG. 5A, created on consideration of the equivalent circuit of the crystal oscillator;

DESCRIPTION OF PREFERRED EMBODIMENTS

Preferred embodiments of this invention are described in detail below, taking the application of this invention to an analog-display type of wristwatch as an example of the use thereof.

1. Overall Structure

Figure 1:
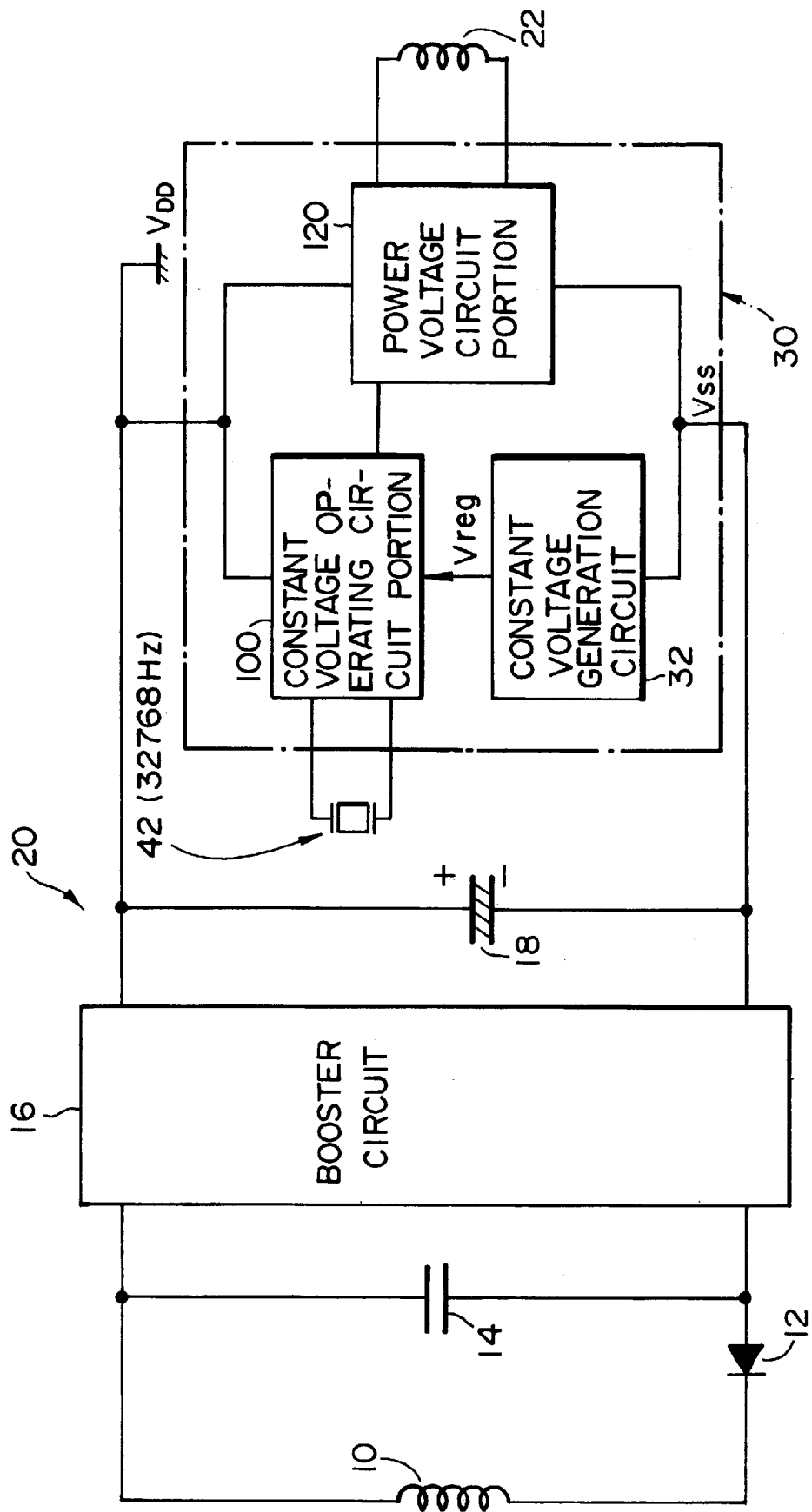
FIG. 1 is a block diagram of an example of an electronic circuit for a wristwatch, to which this invention is applied.

An example of the electronic circuitry used in this type of wristwatch is shown in FIG. 1.

This wristwatch incorporates a generator mechanism that is not shown in the figure. When the user moves a wrist on which the wristwatch is being worn, a oscillating weight of the generator mechanism rotates, the kinetic energy induced thereby causes the rotor of the generator to rotate at high speed, and an AC voltage is output from a generator coil 10 provided on a stator side of the generator.

This AC voltage is rectified by a diode 12, and the rectified voltage charges a secondary battery 14. This secondary battery 14 configures a main power source 20 together with a booster circuit 16 and an auxiliary capacitor 18.

In this embodiment of the invention, when the voltage of the secondary battery 14 falls and is unable to satisfy the demand for the drive voltage of the timepiece, the voltage of the secondary battery 14 is modified by the booster circuit 16 to a voltage that can drive the timepiece, to charge the auxiliary capacitor 18. The voltage of this auxiliary capacitor 18 is then used as a power voltage $V_{ss}$ to drive a timepiece circuit 30.

This timepiece circuit 30 is implemented as a semiconductor device. It uses a crystal oscillator 42, which is connected to the semiconductor device by terminals, to generate an oscillating output at a previously-set oscillation frequency, which in this case is a frequency of 32,768 Hz. It outputs a drive pulse of a different polarity every second, by dividing this oscillating output. This drive pulse is input to a drive coil 22 of a stepping motor (not shown in the figure) that is connected to the timepiece circuit 30. This stepping motor drives the rotor in rotation every time a drive pulse is sent therethrough, to drive hour, minute, and second hands of the timepiece (not shown in the figure) and thus display the time on an analog display.

In this case, the timepiece circuit 30 of this embodiment comprises a power voltage circuit portion 120 that is driven by a power voltage $V_{ss}$ supplied from the main power source, a constant voltage generation circuit 32 that generates a predetermined constant voltage $V_{reg}$ of an absolute value lower than that of the power voltage $V_{ss}$, and a constant-voltage operating circuit portion 100 that is driven by this constant voltage $V_{reg}$.

2. Timepiece circuit

Figure 2:
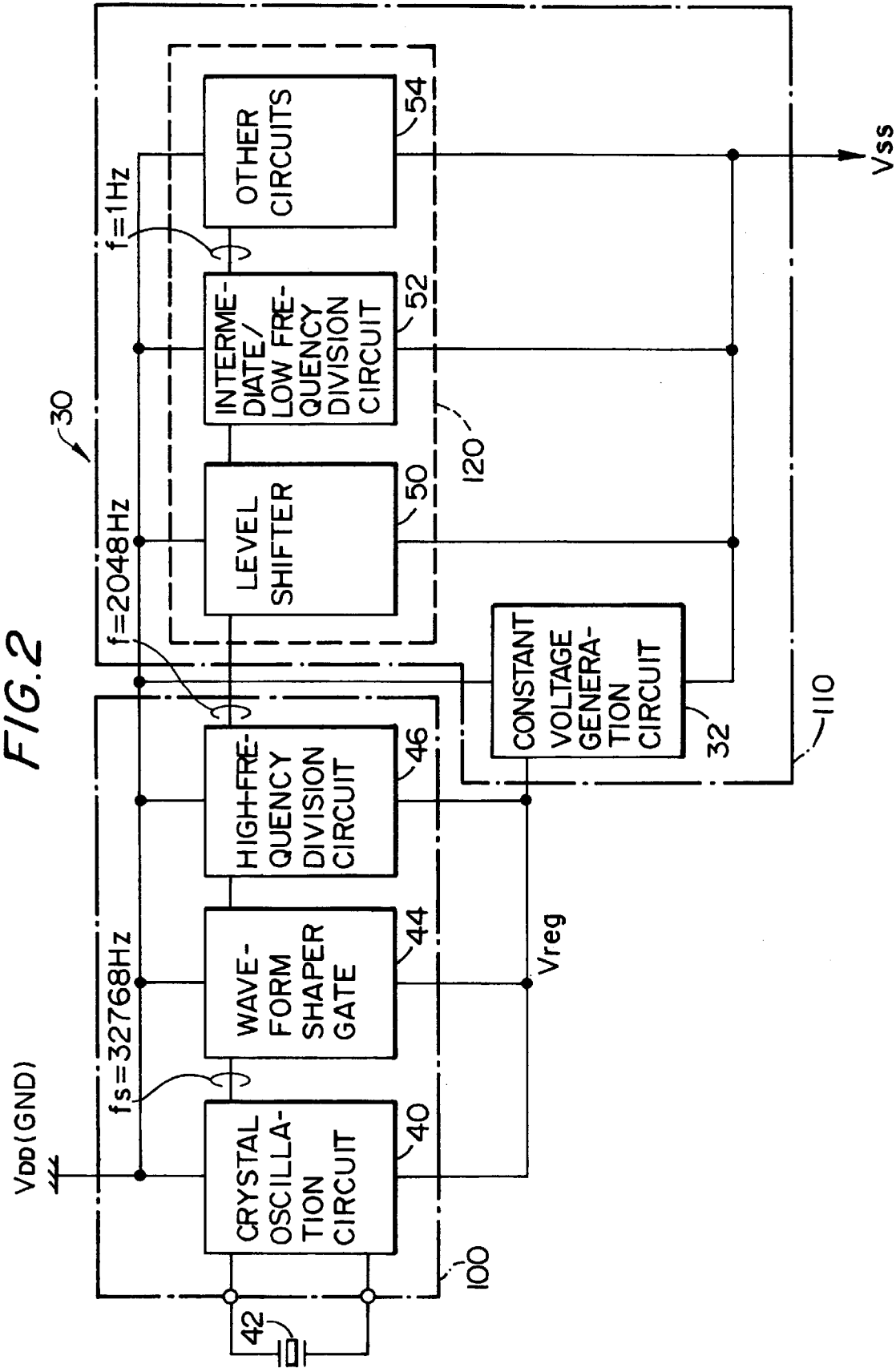
FIG. 2 is a block diagram of a timepiece circuit portion of the electronic circuit of FIG. 1.

A detailed function block diagram of the timepiece circuit 30 is shown in FIG. 2.

The constant-voltage operating circuit portion 100 comprises a crystal oscillation circuit 40 (which partially comprises the externally connected crystal oscillator 42), a waveform shaper gate 44, and a high-frequency division circuit 46.

This power voltage circuit portion 120 comprises a level shifter 50, an intermediate/low frequency division circuit 52, and other circuits 54. Note that the power voltage circuit portion 120 and the constant voltage generation circuit 32 of the timepiece circuit of this embodiment together form a power-voltage operating circuit portion 110 that is driven by the power voltage $V_{ss}$ supplied from the main power source 20.

The crystal oscillation circuit 40 uses the crystal oscillator 42 to output a sine wave at a reference frequency fs of 32,768 Hz to the waveform shaper gate 44.

After this waveform shaper gate 44 has shaped this sine-wave output into a rectangular waveform, it outputs it to the high-frequency division circuit 46.

The high-frequency division circuit 46 divides the reference frequency 32,768 Hz to obtain 2048 Hz, then outputs the thus-divided frequency to the intermediate/low frequency division circuit 52 through the level shifter 50.

This intermediate/low frequency division circuit 52 divides the signal, which has already been divided to obtain 2048 Hz, further to 1 Hz and outputs it to the other circuits 54.

These other circuits 54 include a driver circuit for driving the coil 22 in synchronization with the 1-Hz divided-frequency signal, thus driving the timepiece-driving stepping motor in synchronization with this 1-Hz divided-frequency signal.

In addition to the power-voltage operating circuit portion 110 driven by the voltage $V_{ss}$ supplied from the main power source 20, the timepiece circuit 30 of this embodiment is provided with the constant-voltage operating circuit portion 100 which is driven by the fixed voltage $V_{reg}$ that has an absolute value that is lower than that of the power voltage $V_{ss}$. The reason therefor is discussed below.

In other words, to ensure that the timepiece circuit 30 can operate stably over long periods of time, it is necessary to reduce the power consumption thereof.

Under normal conditions, the power consumption P of a circuit increases in direct proportion to the frequency f of a signal and the capacitance C of the circuit itself, and also to the square of the power voltage V supplied thereto, as follows:

$$P \alpha f c V^2 \qquad (1)$$

With reference to this timepiece circuit 30, it can be seen that one way of reducing the power consumption P of the entire circuit is to set the power voltage V that is supplied to the various parts of the circuit to a voltage of a relatively small absolute value, such as $V_{reg}$. However, if this is done in a simple-minded fashion, the constant voltage generation circuit 32 must be made a large-capacity circuit, so that this is not advisable from the viewpoints of making the entire circuitry more integrated and smaller.

On the other hand, the timepiece circuit 30 can be divided into two main parts: the crystal oscillation circuit 40, the waveform shaper gate 44, and the high-frequency division circuit 46 that uses high signal frequencies, and the other circuits. It is clear from Formula 1 that the frequency of a signal is proportional to the power consumption of the corresponding circuit.

In this case, the constant voltage generation circuit 32 of this embodiment takes the power voltage $V_{ss}$ supplied from the main power source 20, generates the constant voltage $V_{reg}$ of a lower absolute value, and supplies it to the constant-voltage operating circuit portion 100 which handles high-frequency signals, in other words, the crystal oscillation circuit 40, the waveform shaper gate 44, and the high-frequency division circuit 46. By lowering the absolute value of the drive voltage supplied to these circuits 40, 44, and 46 that handle high-frequency signals, the load on the constant voltage generation circuit 32 is not increased by too much, but the power consumption of the entire timepiece circuit 30 can be reduced in an effective manner.

The description now turns to the reason for providing the level shifter 50 between the high-frequency division circuit 46 and the intermediate/low frequency division circuit 52 in this embodiment.

The peak value of the output from the high-frequency division circuit 46 is at the level of the constant voltage $V_{reg}$, so it is lower than the peak value of the voltage $V_{ss}$ from the main power source. This means that, if an output at the level of the constant voltage $V_{reg}$ from the high-frequency division circuit 46 is input without any modification to the intermediate/low frequency division circuit 52, which is driven by the power voltage $V_{ss}$, this input value will not exceed the first-stage logic-level voltage of the intermediate/low frequency division circuit 52, so that the intermediate/low frequency division circuit 52 will not normally operate. That is why the level shifter 50 is used to pull up the peak value of the output from the high-frequency division circuit 46 from the constant-voltage level to the power-voltage level, to ensure that the intermediate/low frequency division circuit 52 normally operates.

3. Crystal Oscillation Circuit

Figure 3:
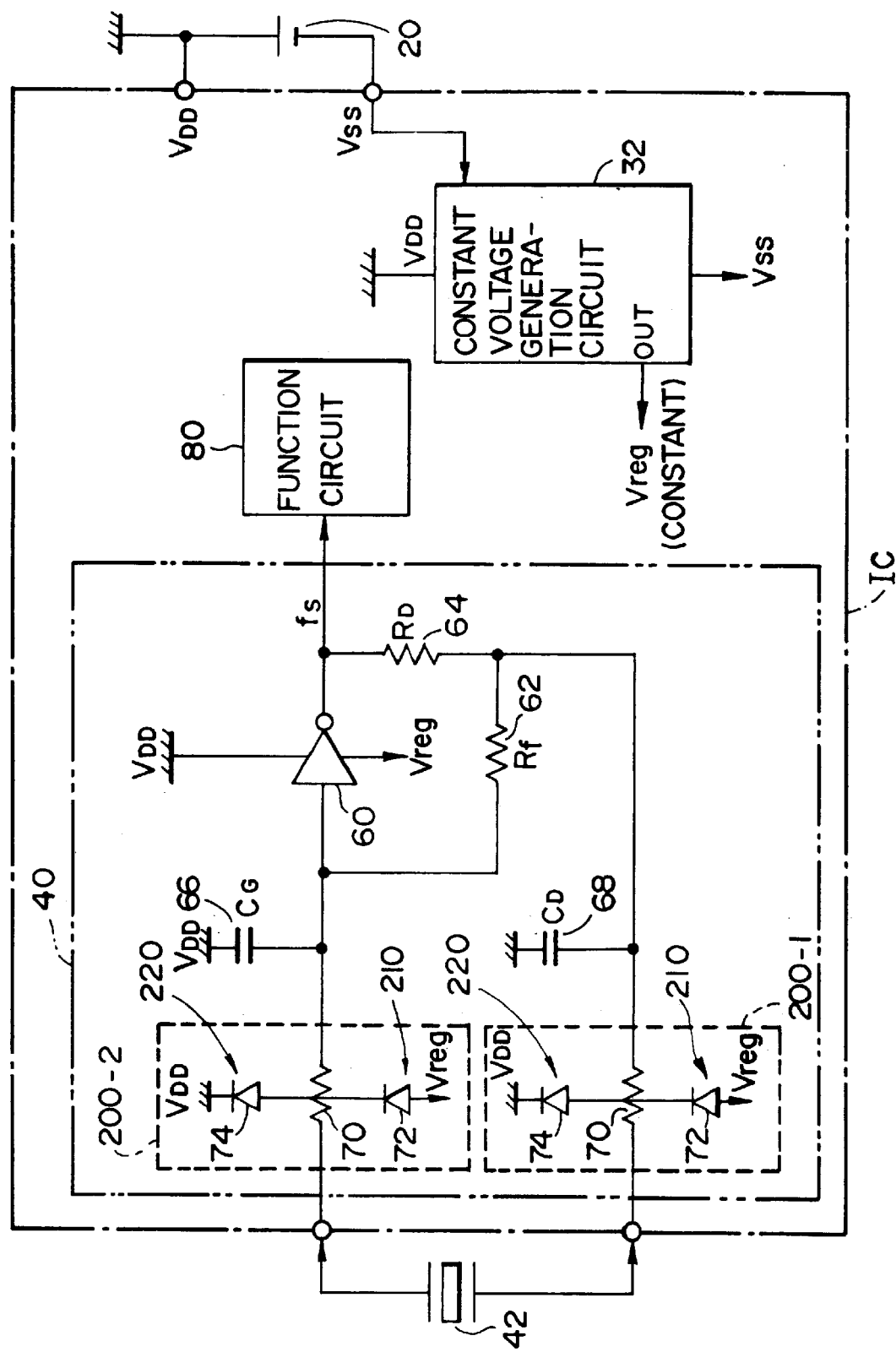
FIG. 3 is an illustrative diagram of a specific configurational example of the crystal oscillation circuit of this embodiment.

A specific example of the circuit configuration of the crystal oscillation circuit 40 of this embodiment is shown in FIG. 3.

This crystal oscillation circuit 40 basically comprises an inverter 60, a feedback resistor 62, a drain resistor 64, and phase-compensation capacitors 66 and 68. It outputs an oscillating output of frequency fs to a function circuit 80. This function circuit 80 comprises the waveform shaper gate 44, the high-frequency division circuit 46, the level shifter 50, the intermediate/low frequency division circuit 52, and the other circuits 54.

Figure 10:
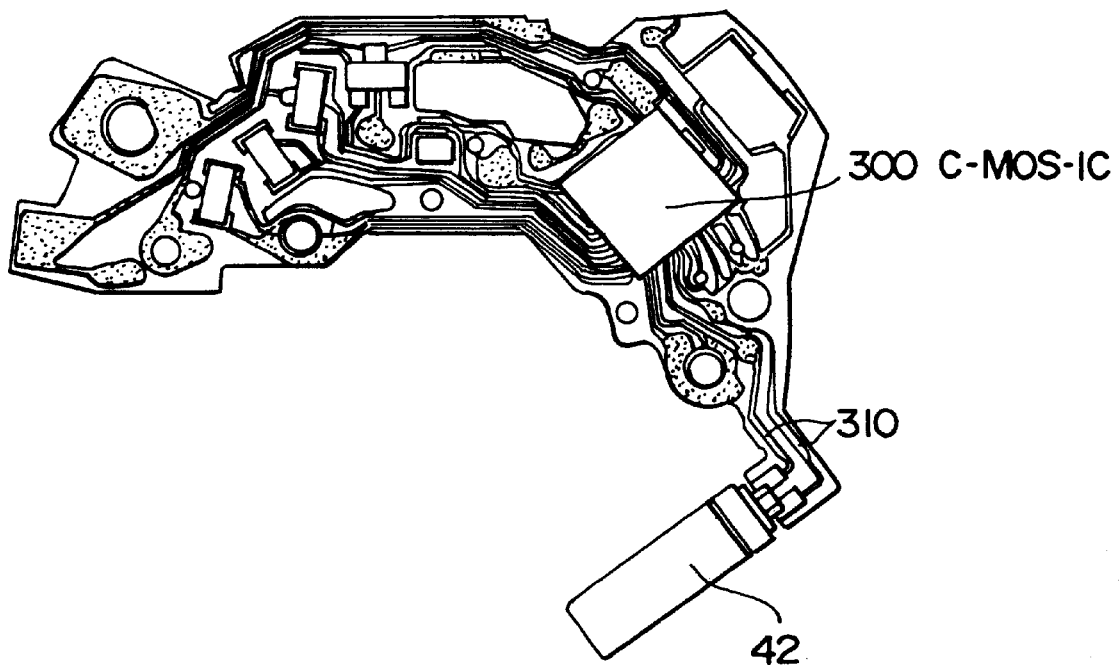
FIG. 10 is an illustrative view of the disposition of a crystal oscillator and a CMOS IC which is the main component of an oscillation circuit, when they are provided on a substrate.

Except for the crystal oscillator 42, the timepiece circuit 30 of FIG. 2 basically could be formed as a semiconductor device such as a CMOS IC 300 as shown in FIG. 10, with the crystal oscillator 42 being connected to the CMOS IC 300 configuring the main components of the oscillation circuitry by wiring 310.

In other words, the crystal oscillator 42 is connected by input-output terminals to the main circuit portions of the crystal oscillation circuit 40 formed on the CMOS IC 300. There is therefore a danger that the input of a surge voltage through these input-output terminals could damage the internal circuitry.

Examples of such a surge voltage that could be considered are a surge voltage invading from the jig used during assembly, or a surge voltage invading from a human operator.

For that reason, electrostatic protective circuits 200-1 and 200-2 are provided in the crystal oscillation circuit 40.

One of these electrostatic protective circuits 200-1 and 200-2 is provided in the signal path connected to each input terminal. Since these electrostatic protective circuits 200-1 and 200-2 have the same structure, the description herein takes the electrostatic protective circuit 200-1 as an example.

This electrostatic protective circuit 200 comprises a resistor 70, a first electrostatic protective circuit portion 210 that causes any electrostatic voltage of negative polarity that invades the signal path of the oscillation circuit to be selectively bypassed through a first semiconductor rectifier element 72 toward the constant voltage $V_{reg}$ side, and a second electrostatic protective circuit portion 220 that causes any electrostatic voltage of a positive polarity that invades the signal path of the oscillation circuit to be selectively bypassed through a second semiconductor rectifier element 74 toward the ground side.

The resistor 70 is connected in series in the signal path to protect the rectifier elements 72 and 74 against surge voltages.

The first and second semiconductor rectifier elements 72 and 74 are each configured by using a pn-junction type of diode. The diode configuring the first semiconductor rectifier element 72 is connected in reverse to the constant voltage ($V_{reg}$) output terminal of the constant voltage generation circuit 32, and the diode configuring the second semiconductor rectifier element 74 is connected in reverse to the ground side thereof.

This configuration ensures that any surge voltage of negative polarity that invades from outside is diverted toward the constant-voltage terminal $V_{reg}$ side thereof, and any surge voltage of positive polarity is diverted toward the ground side, thus preventing them from invading the semiconductor circuits.

This embodiment is characterized in that the first semiconductor rectifier element 72 is connected to the $V_{reg}$-side terminal of the constant voltage generation circuit, as previously described, where the voltage does not fluctuate even if there are fluctuations in the power voltage $V_{ss}$ of the main power source 20. This ensures that the oscillation frequency fs of the crystal oscillation circuit 40 is always constant, without causing any variations in the parasitic capacitances of the semiconductor rectifier elements 72 and 74, even if the power voltage $V_{ss}$ of the main power source 20 fluctuates.

This process is described below in detail.

Figure 4:
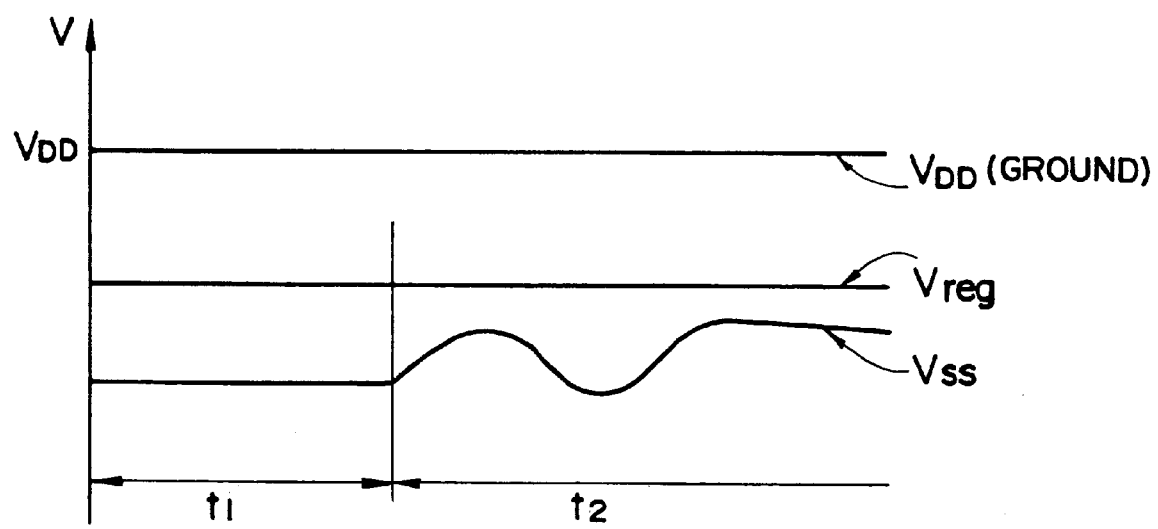
FIG. 4 is a graph illustrating the state of fluctuations in two different power supply voltages used by the circuitry of this embodiment.

The relationship between the constant voltage $V_{reg}$ and the power voltage $V_{ss}$ is shown in FIG. 4. The power voltage $V_{ss}$ supplied from the main power source (in this embodiment, it has a negative value) always has an absolute value that is greater than that of the constant voltage $V_{reg}$ (which also has a negative value in this embodiment) that is output from the constant voltage generation circuit 32. However, fluctuations such as those shown in FIG. 4 often occur in the power voltage $V_{ss}$ due to factors such as fluctuations in load or the charging state of the main power source 20.

In contrast, the constant voltage $V_{reg}$ that is output from the constant voltage generation circuit 32 always remains constant, provided the voltage $V_{ss}$ of the main power source does not fluctuate so far an absolute value of it becomes less than an absolute value of $V_{reg}$.

It was originally considered preferable to connect the first semiconductor rectifier element 72 to the large-capacity main power source 20 side of the circuit, to counteract high-voltage surges. However, as previously described, if the voltage $V_{ss}$ of the main power source 20 fluctuates, the values of the parasitic capacitances of the first and second semiconductor rectifier elements 72 and 74 will also fluctuate.

The parasitic electrostatic capacitance C of each of the pn junctions of the semiconductor rectifier elements 72 and 74 is usually given by:

$$C = A\sqrt{\frac{N_D}{V_A + V_B}} \quad (2)$$

where:

A; Constant  $N_D$; Impurity density
$V_A$; Applied voltage  $V_B$; Potential difference
across pn junction It can be seen from this formula that if the power voltage ($V_A = V_{ss}$ in this case) fluctuates, the parasitic capacitance C will also vary.

If this parasitic capacitance C varies, the result is fluctuations in the oscillation frequency fs of the crystal oscillation circuit 40. This phenomenon is described below.

Countering Fluctuations in Oscillation Frequency

An equivalent circuit of the crystal oscillation circuit 40 is shown in FIG. 5A. The crystal oscillator 42 itself is shown in FIG. 5B and an equivalent circuit thereof is shown in FIG. 5C.

If the equivalent circuit shown in FIG. 5C is used, the crystal oscillation circuit 40 of FIG. 5A can be represented by the circuit shown in FIG. 5D.

The oscillation frequency fs of the LC oscillation circuit 40 represented by the equivalent circuit of FIG. 5D is expressed as follows:

$$fs \doteq \frac{1}{2\pi\sqrt{L'C_G'}} \cdot f_1(C_D') \qquad (3)$$

It is clear from this formula that the oscillation frequency fs will fluctuate if the internal capacitance $C_G'$ of the oscillation circuit varies. In other words, Formula 3 shows that, since the first and second semiconductor rectifier elements 72 and 74 comprise parasitic capacitances $C_{VDD}$ and $C_{vss}$, changes in those values will cause fluctuations in the oscillation frequency fs.

In contrast, the first semiconductor rectifier element 72 of this embodiment is connected to $V_{reg}$, which is a voltage that does not fluctuate. It is therefore possible for the crystal oscillation circuit 40 to always generate an oscillating output of a constant frequency fs, without being affected by fluctuations in the power voltage $V_{ss}$.

In addition, this configuration ensures that the parasitic capacitances of the first and second semiconductor rectifier elements 72 and 74 are also always constant. This means that these parasitic capacitances can be used actively as capacitances of the phase-compensation capacitors 66 and 68. The capacitances of the phase-compensation capacitors 66 and 68 of FIG. 3 can therefore be reduced, or the capacitors 66 and 68 could even be omitted completely in some circumstances.

This makes it possible to reduce the number of components of the crystal oscillation circuit 40 and increase the degree of integration thereof.

This utilization of the parasitic capacitances of the first and second semiconductor rectifier elements 72 and 74 as all or part of capacitances of the phase-compensation capacitors 66 and 68, in accordance with this embodiment, means that the parasitic capacitances of the semiconductor rectifier elements 72 and 74 themselves can be made larger.

In other words, if the phase-compensation capacitors 66 and 68 are provided completely separately from the diodes 72 and 74, the capacitance of the entire circuit 40 will not be small, so it will be necessary to use diodes 72 and 74 that have small parasitic capacitances in order to reduce the power consumption of the entire circuit. In such a case, the resistance to a surge voltage will also fall together with this parasitic capacitance.

In contrast thereto, this embodiment actively utilizes the parasitic capacitances of the semiconductor rectifier elements 72 and 74 as capacitances of the phase-compensation capacitors, making it possible to use semiconductor elements with large parasitic capacitances therefor. As a result, the resistance to a surge voltage of the elements 72 and 74 themselves can be increased, and thus the electrostatic protective capability of the entire circuit can be increased.

4. Another Embodiment

Figure 6:
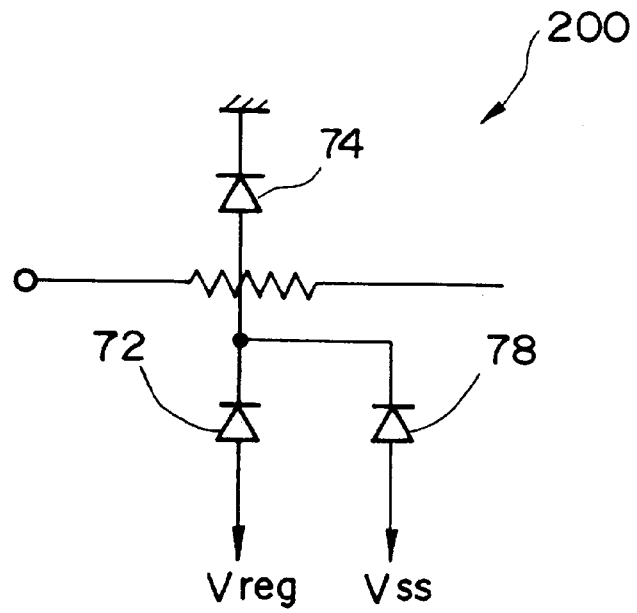
FIG. 6 is an illustrative diagram of another electrostatic protective circuit.

Another example of the application of this invention is shown in FIG. 6. The electrostatic protective circuit of this embodiment uses a third semiconductor rectifier element 78 which is connected in reverse to the main power source $V_{ss}$. Since this makes it possible to create a bypass circuit for surge voltages on the side of the large-capacity main power source 20, the resistance to a surge voltage of the resultant electrostatic protective circuit 200 can be further increased.

Note that the third semiconductor rectifier element 78 is affected by fluctuations in the power voltage $V_{ss}$ in this case and thus the parasitic capacitance will also fluctuate. Therefore, it is preferable to ensure that the magnitude of fluctuations in the parasitic capacitance of the third semiconductor rectifier element 78 is restricted to be only a few percent of the magnitude of fluctuations in the combined parasitic capacitance of the first and third semiconductor rectifier elements 72 and 78, by setting the parasitic capacitance of the first semiconductor rectifier element 72 to be about 10 to 100 times the parasitic capacitance of the third semiconductor rectifier element 78. This makes it possible to ensure that the electrostatic capacitance of the entire circuit always remains stable, to provide a more stable oscillating output.

5. Comparison with Prior Art

Figure 7:
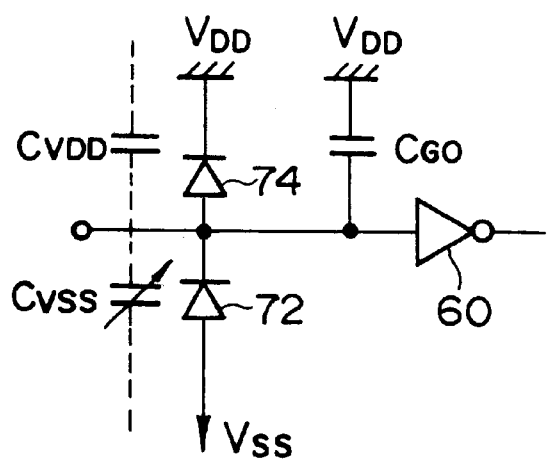
FIG. 7 is an illustrative diagram of an electrostatic protective circuit of the prior art.

An example of a prior-art electrostatic protective circuit in which the semiconductor rectifier element 72 is connected to the power voltage $V_{ss}$ side is shown in FIG. 7. In the prior-art example of FIG. 7, the parasitic capacitance $C_{vss}$ of the first semiconductor rectifier element 72, which is connected to the main power source where the power voltage $V_{ss}$ is subject to fluctuations, is represented by a variable circuit element.

The discussion below concerns the way in which the frequency departure was investigated in this prior-art example of a crystal oscillation circuit using an electrostatic protective circuit.

In the prior-art circuit of FIG. 7, actual measured data on $C_G$ and $C_D$, which are the combined capacitances of the internal circuitry of the IC (semiconductor device) that comprises the electrostatic protective circuit 200, as seen from the gate and drain terminals of a transistor that forms a gate 60 of the crystal oscillation circuit 40, were as given by the formulae below. Note that, since the resistance Rf of the resistor 62 is extremely large in this case, the value of $C_{DO}$ is omitted from the value of $C_G$ and the value of $C_{GO}$ is omitted from the value of $C_D$.

$$C_G = C_{GO} + C_{VDD} + C_{vss} + C_{GP} = 10.8 \text{ (pF)} \quad C_D = C_{DO} + C_{VDD} + C_{vss} + C_{DP} = 6.1 \text{ (pF)} \qquad (4)$$

If the power voltage $V_{ss}$ fluctuates between 1.1 volt and 2.4 volt in this prior-art circuit, the magnitude of fluctuations in the parasitic capacitance $C_{vss}$ is given by: $\Delta C_{vss}$=0.07 (pF).

The ratio of the magnitude of fluctuations in this parasitic capacitance to the total electrostatic capacitance of the crystal oscillation circuit 40 will next be investigated.

At first, the ratio of the magnitude of fluctuations in the parasitic capacitance of the electrostatic protective circuit 200-2 with respect to $C_G$, as given by Formulae 4, is obtained as follows:

$$\frac{\Delta C_{VSS}}{C_{GO} + C_{VDD} + C_{VSS} + C_{GP}} \left( = \frac{7}{1080} \right) \qquad (5)$$

Similarly, the ratio of the magnitudes of fluctuations in the parasitic capacitances of the electrostatic protective circuit 200-1 with respect to $C_D$, as given by Formulae 4, is obtained as follows:

$$\frac{\Delta C_{VSS}}{C_{DO} + C_{VDD} + C_{VSS} + C_{DP}} \left( = \frac{7}{610} \right) \qquad (6)$$

where $C_{GP}$ and $C_{DP}$ are the respective wire capacitances of the crystal oscillation circuit 40.

From these magnitudes of fluctuations in the parasitic capacitance, the frequency departure of the oscillation circuit can be obtained as: (df/dv)=3 (PPM). Converting this into a monthly departure gives approximately 8 seconds. If, for example, the permissible monthly departure for a timepiece is on the order of 15 seconds, this value of 8 seconds in 15 seconds due to fluctuations in the parasitic capacitance is something that cannot possibly be permitted.

In contrast thereto, the connection of the first semiconductor rectifier element 72 of FIG. 3 to the constant voltage $V_{reg}$, which does not fluctuate, ensures that any such fluctuations in the parasitic capacitance can be substantially ignored, and thus the departure in the oscillation frequency of the crystal oscillation circuit 40 itself can be improved to a level such that it can also be ignored, in comparison with that of prior-art circuit.

Figure 8:
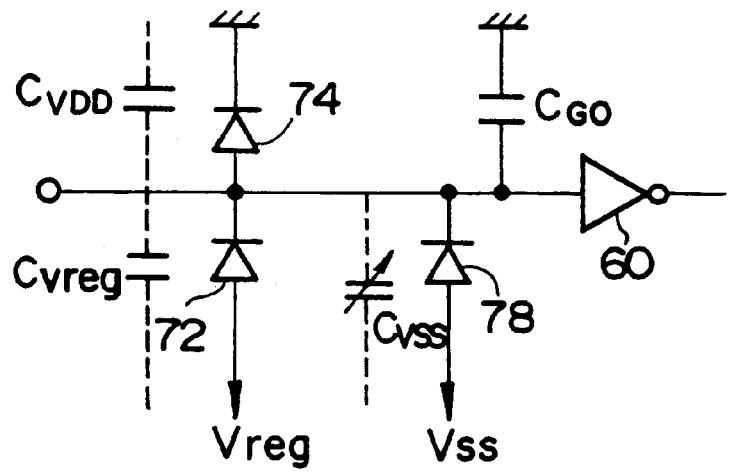
FIG. 8 is an equivalent circuit diagram of the electrostatic protective circuit of FIG. 6.

Similar investigations can be done for the crystal oscillation circuit 40 using the electrostatic protective circuit of the second embodiment of this invention, shown in FIG. 6. An equivalent circuit diagram of this electrostatic protective circuit is shown in FIG. 8. In this case, the third semiconductor rectifier element 78 is an element in which the parasitic capacitance $C_{vss}$ varies.

In the circuitry shown in FIG. 8, the parasitic capacitance of the third semiconductor rectifier element 78 is designed to be sufficiently smaller than that of the first semiconductor rectifier element 72, so that the frequency departure of the entire circuitry can be made much smaller than that of the prior-art example of the use of the electrostatic protective circuit in FIG. 7, even if the parasitic capacitance $C_{vss}$ fluctuates.

Figure 9:
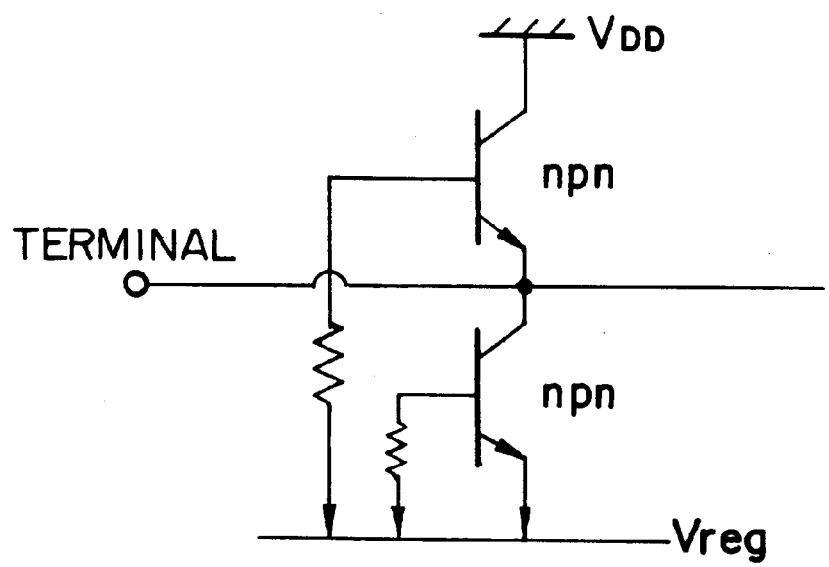
FIG. 9 is an illustrative diagram of an electrostatic protective circuit including another type of semiconductor element.

Note that, although the embodiments of this invention were described above as using diodes as semiconductor rectifier elements by way of example, a protective circuit can equally well be created by using various other types of semiconductor rectifier element if necessary. For example, an electrostatic protective circuit could be formed by using bipolar transistors as the semiconductor rectifier elements, as shown in FIG. 9.

In addition, although the description of this embodiment related to an example of the application to a portable timepiece (a wristwatch), this invention can be applied to various other electronic devices, such as portable telephones and portable computer terminals.

What is claimed is:

1. An oscillation circuit that is driven by a constant voltage $V_{reg}$ having an absolute value that is lower than an absolute value of a power voltage of a main power source, wherein said oscillation circuit comprises:

a first electrostatic protective circuit connected between a signal path of said oscillation circuit and said constant voltage $V_{reg}$ side of said oscillation circuit, for causing any electrostatic voltage of a first polarity that invades said signal path to be diverted selectively to said constant voltage $V_{reg}$ side through a first semiconductor rectifier element; and a second electrostatic protective circuit connected between said signal path of said oscillation circuit and a reference potential side of said oscillation circuit, for causing any electrostatic voltage of a second polarity that invades said signal path to be diverted selectively to said reference potential side through a second semiconductor rectifier element.

2. An oscillation circuit as defined in claim 1, wherein said first electrostatic protective circuit comprises:

a third semiconductor rectifier element connected between said signal path of said oscillation circuit and said power voltage, for causing any electrostatic voltage of said first polarity that invades said signal path to be diverted selectively to said power voltage side.

3. An oscillation circuit as defined in claim 2, wherein the parasitic capacitance of said third semiconductor rectifier element is set to be lower than the parasitic capacitance of said first semiconductor rectifier element.

4. An oscillation circuit as defined in claim 1, wherein the parasitic capacitances of said first and second semiconductor rectifier elements are used as all or part of the capacitance of a phase-compensation capacitor.

5. An electronic circuit comprising the oscillation circuit defined in claim 1.

6. A semiconductor device comprising the oscillation circuit defined in claim 1.

7. A timepiece comprising the oscillation circuit defined in claim 1.

8. An electronic device comprising the oscillation circuit defined in claim 1.

* * * * *